(12) United States Patent
Tseng et al.

(10) Patent No.: US 11,915,755 B2
(45) Date of Patent: Feb. 27, 2024

(54) LAYOUT OF SEMICONDUCTOR MEMORY DEVICE

(71) Applicant: UNITED MICROELECTRONICS CORP., Hsin-Chu (TW)

(72) Inventors: Chun-Yen Tseng, Tainan (TW); Yu-Tse Kuo, Tainan (TW); Shu-Ru Wang, Taichung (TW); Chun-Hsien Huang, Tainan (TW); Hsin-Chih Yu, Hsinchu County (TW); Meng-Ping Chuang, Hsinchu (TW); Li-Ping Huang, Miaoli County (TW); Yu-Fang Chen, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 157 days.

(21) Appl. No.: 17/580,591

(22) Filed: Jan. 20, 2022

(65) Prior Publication Data

US 2023/0197153 A1    Jun. 22, 2023

(30) Foreign Application Priority Data

Dec. 21, 2021    (CN) .......................... 202111571043.1

(51) Int. Cl.
*G11C 15/04*    (2006.01)
(52) U.S. Cl.
CPC .................................. *G11C 15/04* (2013.01)
(58) Field of Classification Search
USPC .................................. 365/49.11, 49.1, 49.17
See application file for complete search history.

(56) References Cited

U.S. PATENT DOCUMENTS

| | | | | |
|---|---|---|---|---|
| 6,256,216 | B1 * | 7/2001 | Lien ...................... | G11C 15/046 365/204 |
| 6,400,593 | B1 * | 6/2002 | Lien ........................ | G11C 15/04 365/168 |
| 8,848,412 | B1 * | 9/2014 | Yeung ..................... | G11C 15/00 365/49.1 |
| 9,431,106 | B1 * | 8/2016 | Roy .................... | G11C 13/0002 |
| 9,484,096 | B1 * | 11/2016 | Chen ..................... | G11C 15/046 |
| 9,502,112 | B2 | 11/2016 | Nii | |
| 9,543,013 | B1 * | 1/2017 | Govindaraj .......... | G11C 15/046 |
| 10,366,756 | B1 * | 7/2019 | Tseng ..................... | G11C 15/04 |
| 10,861,549 | B1 * | 12/2020 | Tseng .................. | H01L 27/0207 |
| 11,475,953 | B1 * | 10/2022 | Tseng ..................... | H10B 10/12 |

(Continued)

*Primary Examiner* — Tan T. Nguyen
(74) *Attorney, Agent, or Firm* — Winston Hsu (57) ABSTRACT

A layout of a semiconductor memory device includes a substrate and a ternary content addressable memory (TCAM). The TCAM is disposed on the substrate and includes a plurality of TCAM bit cells, where at least two of the TCAM bit cells are mirror-symmetrical along an axis of symmetry, and each of the TCAM bit cells includes two storage units electrically connected to two word lines respectively, and a logic circuit electrically connected to the storage units. The logic circuit includes two first reading transistors, and two second reading transistors, where each of the second reading transistors includes a gate and source and drain regions, the source and drain regions of the second reading transistors are electrically connected to two matching lines and the first reading transistors, respectively, where the word lines are disposed parallel to and between the matching lines.

16 Claims, 9 Drawing Sheets

(56) References Cited

U.S. PATENT DOCUMENTS

2005/0276086 A1\* 12/2005 Perry .................... G11C 15/04
                                                    365/49.17
2020/0365207 A1\* 11/2020 Huang .................... G11C 8/16
2022/0238158 A1\*  7/2022 Huang ................... H10B 10/12

\* cited by examiner

LAYOUT OF SEMICONDUCTOR MEMORY DEVICE

BACKGROUND OF THE INVENTION

1. Field of the Invention

The present disclosure relates generally to layouts of semiconductor devices, and more particularly to layouts of semiconductor devices including a ternary content addressable memory (TCAM).

2. Description of the Prior Art

In the conventional memory array structures, a six-transistor static-random access memory (6T-SRAM) cell is usually used as a bit cell structure. As the performance of memory is improved, the memory bit cell structure may further include two transistors. Accordingly, a ternary content addressable memory (TCAM) is widely used to effectively speedup data search speed so as to solve various problems in searching. However, there are some issues such as non-charge sharing concern for matching line, lower matching line coupling effect, low impedance, etc., presented between the matching lines of the conventional TCAM, which may cause the node voltage on the matching lines to drop incorrectly and further cause misjudgments, thereby increasing the difficulty in designing the layout of related devices.

SUMMARY OF THE INVENTION

An object of the present disclosure is to provide a layout of a semiconductor memory device, where the layout structure of a ternary content addressable memory (TCAM) is improved, so as to reduce the problem of matching line coupling effect effectively and to avoid charge sharing concern for matching line.

To achieve the aforementioned object, the present disclosure provides a layout of a semiconductor memory device, including a substrate and a ternary content addressable memory (TCAM). The TCAM is disposed on the substrate and includes a plurality of TCAM bit cells, and at least two of the TCAM bit cells are mirror-symmetrical along an axis of symmetry. Each of the TCAM bit cells includes two storage units electrically connected to two word lines, respectively, and a logic circuit electrically connected to the two storage units. The logic circuit includes two first reading transistors, and two second reading transistors. Each of the second reading transistors includes a gate and source and drain regions. The source and drain regions of the second reading transistors are electrically connected to two matching lines and the first reading transistors, respectively, where the word lines are disposed parallel to and between the matching lines.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

The present disclosure may be understood by reference to the following detailed description, taken in conjunction with the drawings as described below. It should be noted that the technical features in different embodiments described in the following may be replaced, recombined, or mixed with one another to constitute another embodiment without departing from the spirit of the present disclosure.

Although the disclosure is described with respect to specific embodiments, the principles of the invention, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person of ordinary skill in the art.

Figure 1:
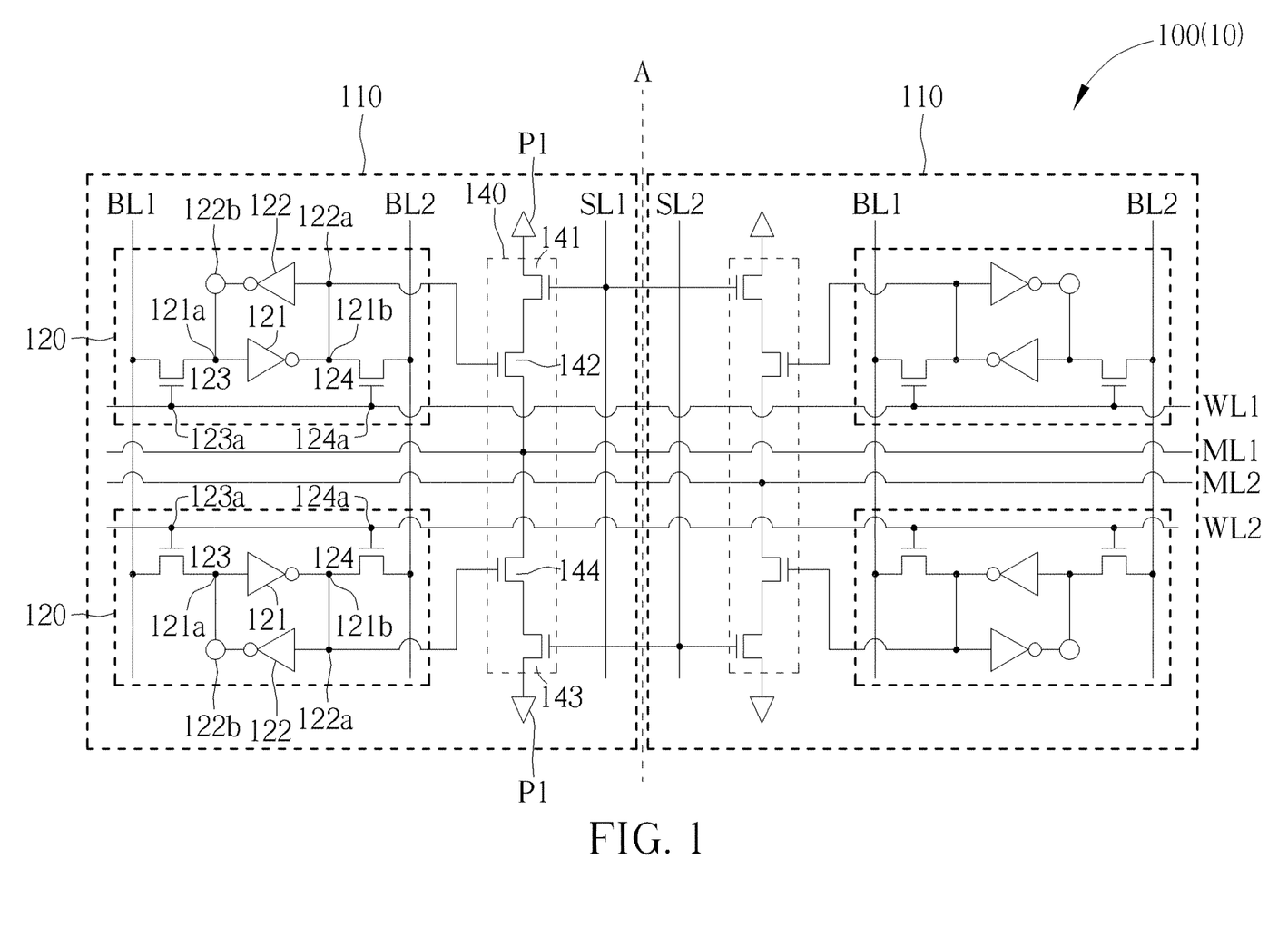
FIG. 1 shows a schematic circuit diagram of a ternary content addressable memory in a semiconductor memory device according to an embodiment of the present disclosure.

Please refer to FIG. 1 to FIG. 6, which illustrate schematic diagrams of a semiconductor memory device 10 according to an embodiment of the present disclosure. Where, FIG. 1 is a schematic circuit diagram of a ternary content addressable memory (TCAM) 100 in the semiconductor memory device 10, and FIG. 2 to FIG. 6 are schematic diagrams of a layout of the TCAM 100 in the semiconductor memory device 10. Please refer to FIG. 1, the semiconductor memory device 10 includes a substrate (not shown) and the TCAM 100 disposed on the substrate. The substrate includes, for example, a silicon substrate, a silicon-containing substrate, or a silicon-on-insulator (SOI) substrate. The TCAM 100 may include a plurality of TCAM bit cells 110, a plurality of bit lines BL1, BL2, a plurality of word lines WL1, WL2, a plurality of searching lines SL1, SL2, and a plurality of matching lines ML1, ML2. Moreover, each TCAM bit cell 110 is electrically connected to the corresponding bit lines BL1, BL2, the corresponding word lines WL1, WL2, the corresponding searching lines SL1, SL2, and the corresponding matching lines ML1, ML2. For clarity in the drawing, FIG. 1 only illustrates two adjacent TCAM bit cells 110, and the bit lines BL1, BL2, the word lines WL1, WL2, the searching lines SL1, SL2, and the matching lines ML1, ML2, etc., corresponding to each TCAM bit cell 110, where the two adjacent TCAM bit cells 110 are mirror-symmetrical along an axis A of symmetry of the TCAM 100, but not limited thereto. Those skilled in the art should understand that the TCAM 100 may include more than two TCAM bit cells 110, and each TCAM bit cell 110 may have the same electrical connection to form a memory array. Therefore, this embodiment is described by taking a single TCAM bit cell 110 as an example, but not limited thereto.

In detail, each TCAM bit cell 110 may include two storage units 120 and a logic circuit 140. Each storage unit 120 includes, for example, a static random access memory composed of six transistors (6T-SRAM) cell, but not limited thereto. In this embodiment, each storage unit 120 may include a first inverter 121, a second inverter 122, and two transistors, such as a first pass-gate transistor 123 and a second pass-gate transistor 124. In each storage unit 120, the first inverter 121 may have a first terminal 121a and a second terminal 121b, and the second inverter 122 may have a first terminal 122a and a second terminal 122b. The first terminals 121a, 122a and the second terminals 121b, 122b are configured to as input terminals and output terminals, respectively. The first terminal 121a of the first inverter 121 may be electrically connected to the source/drain of the first pass-gate transistor 123 and the second terminal 122b of the second inverter 122. The first terminal 122a of the second inverter 122 may be electrically connected to the source/drain of the second pass-gate transistor 124 and the second terminal 121b of the first inverter 121, as shown in FIG. 1. In addition, although the detailed components of the first inverter 121 and the second inverter 122 are not further depicted in FIG. 1, those skilled in the art should understand that both the first inverter 121 and the second inverter 122 may include a pull-up (PU) transistor (not shown in FIG. 1) and a pull-down (PD) transistor (not shown in FIG. 1). In each of the inverters 121, 122, the gates (not shown) of the pull-up transistor and the pull-down transistor are electrically connected to each other and used as the first terminals 121a, 122a, and the source/drain (not shown) of the pull-up transistor and the pull-down transistor are electrically connected to each other and used as the second terminals 121b, 122b. The source/drain of the pull-up transistor and the source/drain of the pull-down transistor may be electrically connected to different voltage sources (not shown), respectively.

It should be noted that in the TCAM bit cell 110, the source/drain of the first pass-gate transistor 123 of each storage unit 120 may be electrically connected to the corresponding same bit line BL1, and the source/drain of the second pass-gate transistor 124 may be electrically connected to the corresponding same bit line BL2. In addition, the gate 123a of the first pass-gate transistor 123 and the gate 124a of the second pass-gate transistor 124 of one of the two storage units 120, and the gate 123a of the first pass-gate transistor 123 and the gate 124a of the second pass-gate transistor 124 of another storage unit 120 are electrically connected to different word lines WL1, WL2, respectively. Moreover, as shown in FIG. 1, each logic circuit 140 may include two first reading transistors (RPG) 141, 143 and two second reading transistors (RPD) 142, 144. The gates of the two second reading transistors 142 and 144 may be electrically connected to the first terminals 122a of the second inverters 122, respectively. The gates of the first reading transistors 141, 143 may be electrically connected to different searching lines SL1, SL2, respectively. The source/drain of the second reading transistors 142, 144 may be electrically connected to the corresponding matching line ML1, and the source/drain of the first reading transistors 141, 143 may be electrically connected to voltage sources P1.

Figure 2:
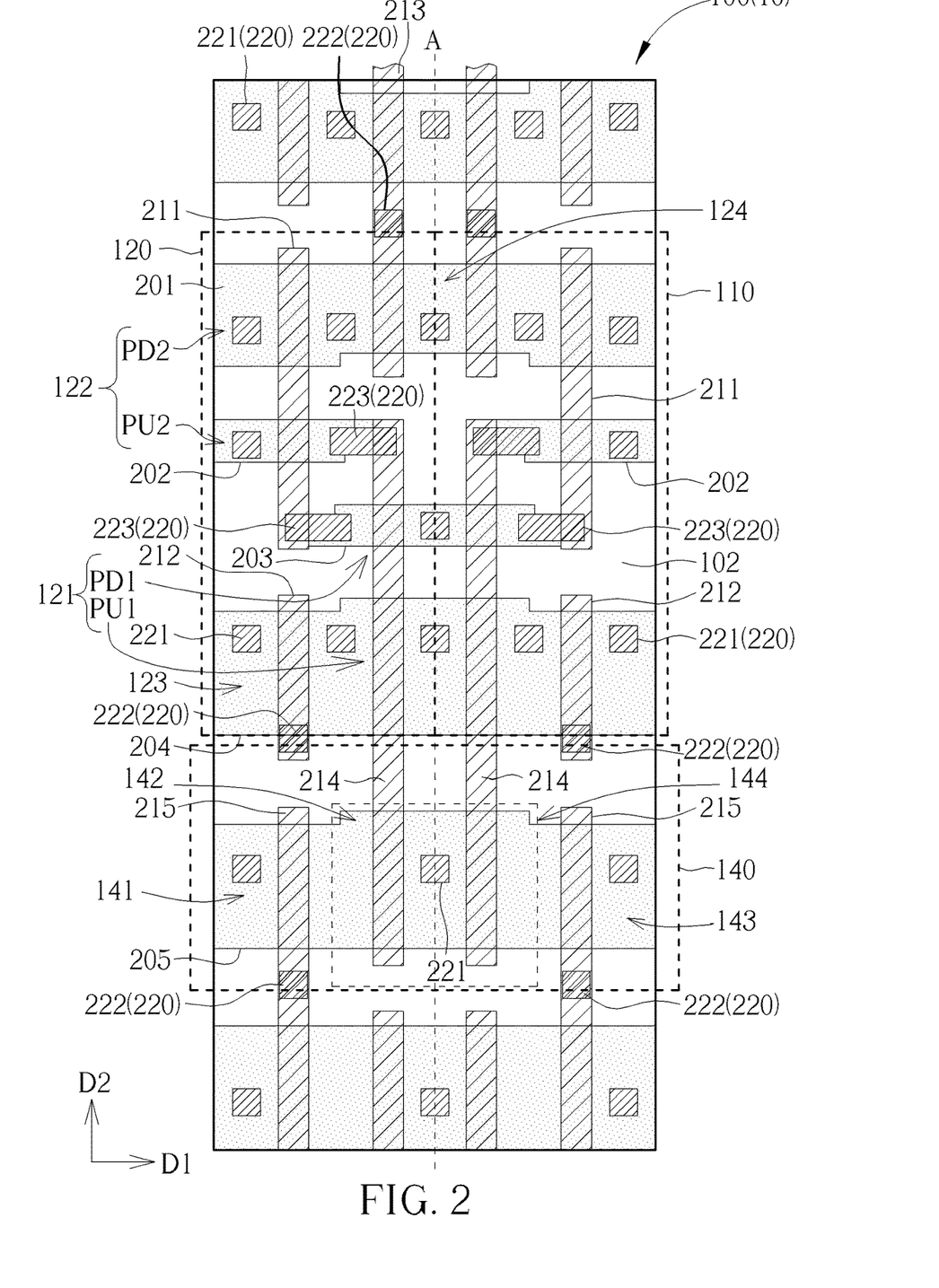
FIG. 2 to FIG. 6 illustrates schematic top views of a layout structure of a ternary content addressable memory in a semiconductor memory device according to an embodiment of the present disclosure.

Please refer to FIG. 2, which is a schematic top view of a layout structure of the front-end-of-line (FEOL) of the TCAM bit cell 110. The storage unit 120 may include a first active area 201, a second active area 202, a third active area 203, a fourth active area 204, a first gate line 211, a second gate line 212, a third gate line 213, and a fourth gate line 214. The first active area 201, the second active area 202, the third active area 203, and the fourth active area 204 may extend along a first direction D1, and the first active area 201, the second active area 202, the third active area 203, and the fourth active area 204 are arranged in sequence from upper to low along a second direction D2. A portion of the first active area 201 and a portion of the fourth active area 204 may not extend along the first direction D1, but the overall of the first active area 201 and the fourth active area 204 may be regarded as extending along the first direction D1. In an embodiment, the first active area 201 and the fourth active area 204 have the same length in the first direction D1, but not limited thereto. The first active area 201, the second active area 202, the third active area 203, and the fourth active area 204 may be surrounded by a shallow trench isolation (STI) region 102 and electrically isolated from each other by the STI region 102.

The first active area 201, the second active area 202, the third active area 203, and the fourth active area 204 respectively include, for example, a doped region (not shown) formed in the substrate. Thus, the first active area 201, the second active area 202, the third active area 203, and the fourth active area 204 may be respectively used to form a planar transistor, but not limited thereto. In another embodiment, the first active area 201, the second active area 202, the third active area 203, and the fourth active area 204 may also respectively and optionally include a fin-shaped structure (not shown). Thus, the first active area 201, the second active area 202, the third active area 203, and the fourth active area 204 may be respectively used to form a fin field-effect transistor (FINFET). In this embodiment, the first active area 201 and the fourth active area 204 may have a first conductivity type, such as a P-type, and the second active area 202 and the third active area 203 may have a second conductivity type different from the first conductivity type, such as an N-type, but not limited thereto.

As shown in FIG. 2, the first gate line 211, the second gate line 212, the third gate line 213, and the fourth gate line 214 may respectively extend along the second direction D2. The fourth gate line 214 may cross the third active area 203 and the fourth active area 204, so that the fourth gate line 214 across the fourth active area 204 may form the gate of a first pull-down transistor PD1 of the first inverter 121, and the source and drain regions of the first pull-down transistor PD1 of the first inverter 121 are disposed in the fourth active area 204 and on two sides of the fourth gate line 214, respectively. The fourth gate line 214 across the third active area 203 may form the gate of a first pull-up transistor PU1 of the first inverter 121, and the source and drain regions of the first pull-up transistor PU1 are disposed in the third active area 203 and on two sides of the four gate line 214, respectively. The second gate line 212 may cross the fourth active area 204, so that the second gate line 212 across the fourth active area 204 may form the gate of the first pass-gate transistor 123, and the source and drain regions of the first pass-gate transistor 123 are disposed in the fourth active area 204 and on two sides of the second gate line 212, respectively. Therefore, the source/drain region of the first pass-gate transistor 123 and the source/drain region of the first pull-down transistor PD1 of the first inverter 121 may be formed from the same doped region in the fourth active area 204, as shown in FIG. 2, but not limited thereto.

In addition, the third gate line 213 may cross the first active area 201, so that the third gate line 213 across the first active area 201 may form the gate of the second pass-gate transistor 124, and the source and drain regions of the second pass-gate transistor 124 are disposed in the first active area 201 and on two sides of the third gate line 213, respectively. The first gate line 211 may cross the first active area 201 and the second active area 202, so that the first gate line 211 across the first active area 201 may form the gate of a second pull-down transistor PD2 of the second inverter 122, and the source and drain regions of the second pull-down transistor PD2 of the second inverter 122 are disposed in the first active area 201 and on two sides of the first gate line 211, respectively. The first gate line 211 across the second active area 202 may form the gate of a second pull-up transistor PU2 of the second inverter 122, and the source and drain regions of the second pull-up transistor PU2 are disposed in the second active area 202 and on two sides of the first gate line 211, respectively. In this embodiment, the source/drain region of the second pass-gate transistor 124 and the source/drain region of the second pull-down transistor PD2 of the second inverter 122 may be formed from the same doped region in the first active area 201, but not limited thereto. In one embodiment, the first pull-up transistor PU1 and the second pull-up transistor PU2 are, for example, p-type field-effect transistors (pFETs), and the first pull-down transistor PD1, the second pull-down transistor PD2, the first pass-gate transistor 123, and the second pass-gate transistor 124 may be n-type field effect transistors (nFETs). It should be noted that the first active area 201, the second active area 202, the third active area 203, and the fourth active area 204 are symmetrical to each other by taking the axis A of symmetry of the TCAM 100 as the center of symmetry. Moreover, the locations of the first gate line 211, the second gate line 212, the third gate line 213, and the fourth gate line 214 with respect to the first active area 201, the second active area 202, the third active area 203, and the fourth active area 204 may also be symmetrical to each other by taking the axis A of symmetry of the TCAM 100 as the center of symmetry. Therefore, the two storage units 120 of the TCAM bit cell 110 may be mirror-symmetrical to each other, as shown in FIG. 2.

As shown in FIG. 2, the logic circuit 140 may include a fifth active area 205, the fourth gate line 214, and a fifth gate line 215. The fifth active area 205 may extend along the first direction D1 and is arranged lower than the fourth active area 204 in the second direction D2. In this embodiment, the fifth active area 205 has the same length as that of the first active area 201 and the fourth active area 204. Moreover, the fifth active area 205, the fourth gate line 214, and the fifth gate line 215 are also symmetrical to each other by taking the axis A of symmetry of the TCAM 100 as the center of symmetry, so that the two first reading transistors 141, 143 and the two second reading transistors 142, 144 of the logic circuit 140 may be mirror-symmetrical to each other, as shown in FIG. 2, but not limited thereto. The fifth gate line 215 may extend along the second direction D2 and cross the fifth active area 205, so that the fifth gate line 215 across the fifth active area 205 may be used as the gate of the first reading transistors 141, 143, and the source and drain regions of the first reading transistors 141, 143 are disposed in the fifth active area 205 and on two sides of the fifth gate line 215, respectively. In addition, the fourth gate line 214 may also extend along the second direction D2 and cross the fifth active area 205, so that the fourth gate line 214 across the fifth active area 205 may be used as the gate of the second reading transistors 142, 144, and the source and drain regions of the second reading transistors 142, 144 are disposed in the fifth active area 205 and on two sides of the fourth gate line 214, respectively. Therefore, the source and drain regions of the first reading transistors 141, 143 and the source and drain regions of the second reading transistors 142, 144 may be disposed in the same fifth active area 205, for example, may be formed from the same doped region.

It should be noted that the layout structure as shown in FIG. 2 further includes a plurality of plugs 220 disposed in an insulating layer (not shown), which are sequentially disposed on each active area and/or each gate line to be electrically connected to the first active area 201, the second active area 202, the third active area 203, the fourth active area 204, the fifth active area 205, the first gate line 211, the second gate line 212, the third gate line 213, the fourth gate line 214, and the fifth gate line 215, respectively. In one embodiment, the plugs 220 include, for example, a conductive material with low-resistance, such as tungsten (W), aluminum (Al), copper (Cu), etc., but not limited thereto.

In detail, the plugs 220 include a plurality of plugs 221 respectively disposed on the source and drain regions of the second pull-down transistor PD2, the source and drain regions of the second pull-up transistor PU2, the source and drain regions of the first pull-down transistor PD1, the source and drain regions of the first pull-up transistor PU1, the source and drain regions of the second pass-gate transistor 124, the source and drain regions of the first pass-gate transistor 123, the source and drain regions of the first reading transistors 141, 143, and the source and drain regions of the second reading transistors 142, 144 and to be electrically connected thereto. In addition, the plugs 220 include a plurality of plugs 222 respectively disposed on the gate of the first pass-gate transistor 123, the gate of the second pass-gate transistor 124, and the gates of the first reading transistors 141, 143 to be electrically connected thereto. The plugs 220 further include a plurality of plugs 223 simultaneously disposed on the gate of the first pull-up transistor PU1 and the source/drain region of the second pull-up transistor PU2, and simultaneously disposed on the gate of the second pull-up transistor PU2 and the source/drain region of the first pull-up transistor PU1, thereby electrically connecting the gate of the first pull-up transistor PU1 to the source/drain region of the second pull-up transistor PU2 with each other, and electrically connecting the gate of the second pull-up transistor PU2 to the source/drain region of the first pull-up transistor PU1 with each other.

Figure 3:
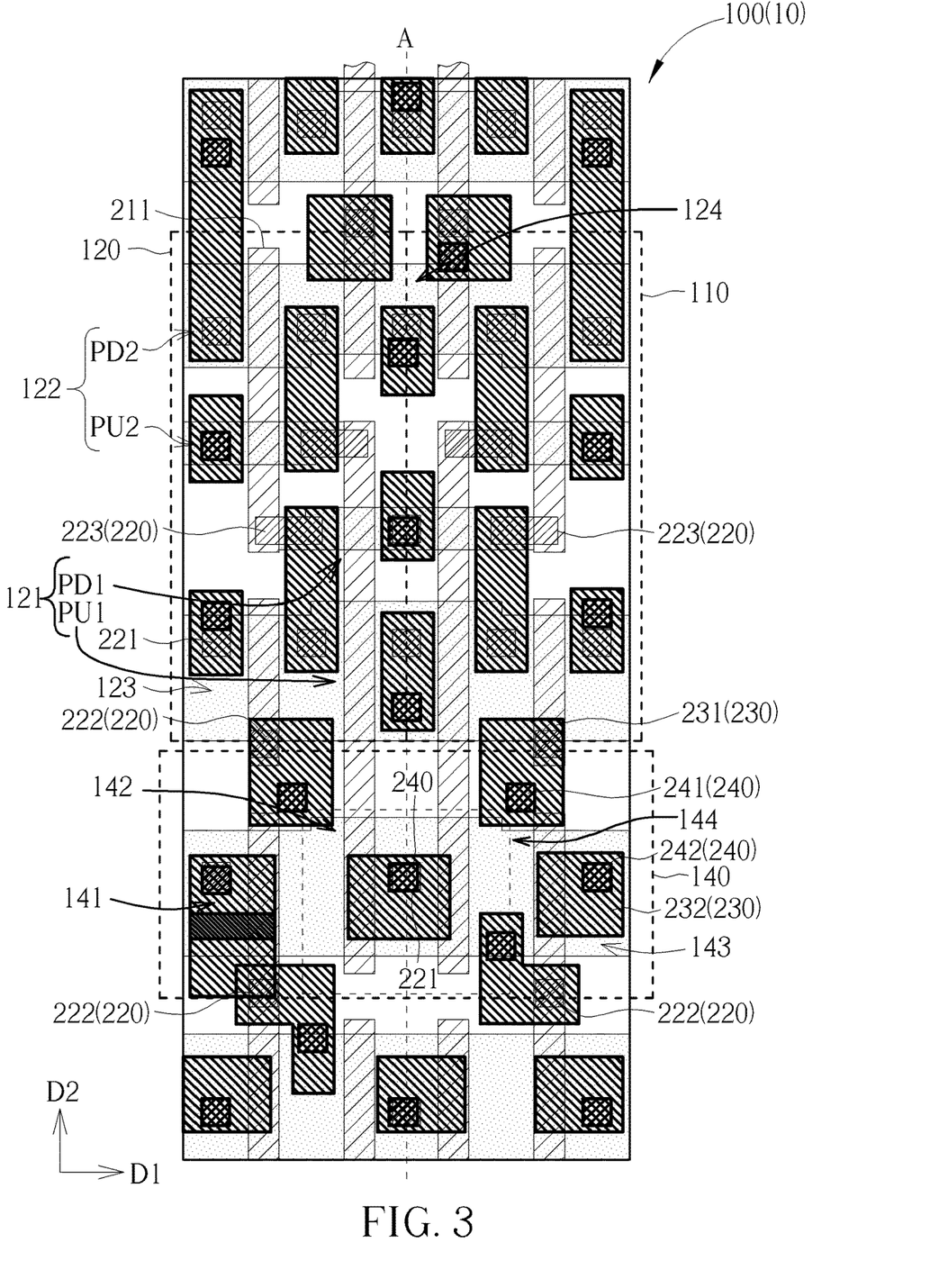

Next, please refer to FIG. 3 and FIG. 2 together. FIG. 3 is a schematic top view of a layout structure of a first metal layer (M1) and first-layered plugs (V1) of the TCAM bit cell 110, where, in order to clearly show the layout structure of the first metal layer and the first-layered plugs, the reference numerals corresponding to the gate lines and the active areas are omitted in FIG. 3. As shown in FIG. 3, the TCAM bit cell 110 further includes a metal layer 230 and plugs 240 disposed in another insulating layer (not shown), where the metal layer 230 is disposed above the plugs 220 to be electrically connected to the corresponding plugs 220. The plugs 240 are sequentially disposed above the metal layer 230. In an embodiment, the metal layer 230 and the plugs 240 include, for example, a conductive material with low-resistance, such as tungsten, aluminum, copper, etc., but not limited thereto.

In detail, the metal layer 230 may be disposed on the plugs 223 and the plugs 221 to electrically connect the gate of the second pull-up transistor PU2, the source/drain region of the first pull-up transistor PU1, and the common source/drain region of the second pull-down transistor PD2 and the second pass-gate transistor 124 with each other, and to electrically connect the source/drain region of the first pull-up transistor PU1, the gate of the second pull-up transistor PU2, and the common source/drain region of the first pull-down transistor PD1 and the first pass-gate transistor 123 with each other. In addition, it should be noted that the metal layer 230 disposed in the logic circuit 140 further includes a first portion 231 and a second portion 232, where the first portion 231 is electrically connected to the plug 222 (electrically connected to the gate of the first pass-gate transistor 123), and further extends rightward or leftward in the first direction D1 from the top of the plug 222, and finally falls on the STI region 102 and on the right or left side of the plug 222. In addition, a plug 241 is disposed on the first portion 231. The second portion 232 is electrically connected to the plug 221 (electrically connected to the source/drain region of the first reading transistors 141, 143), and further extends leftward or rightward in the first direction D1 from the top of the plug 221, and finally falls on the gate of the first reading transistor 141. In addition, a plug 242 is disposed on the second portion 232, as shown in FIG. 3.

Figure 4:
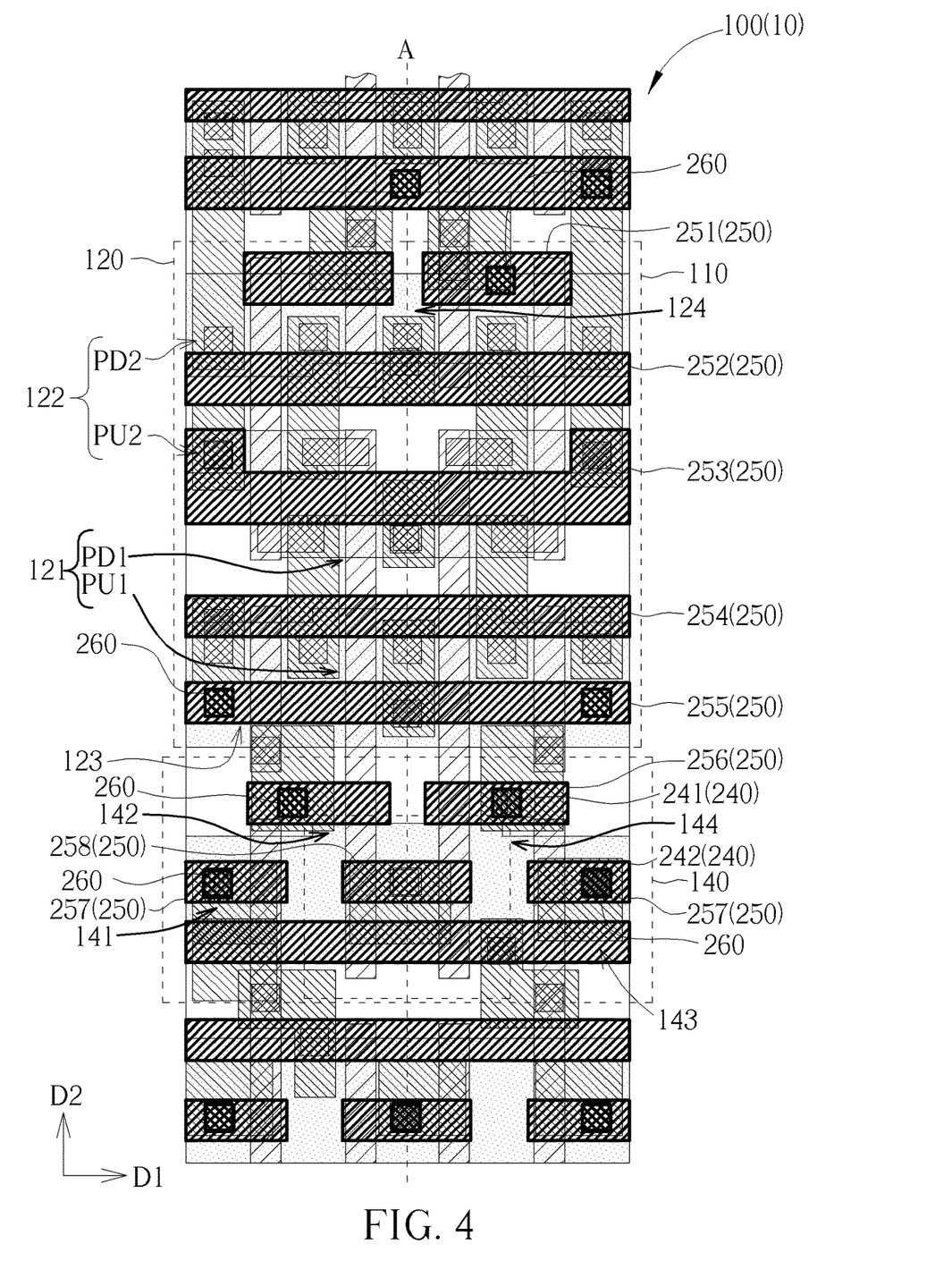
Figure 5:
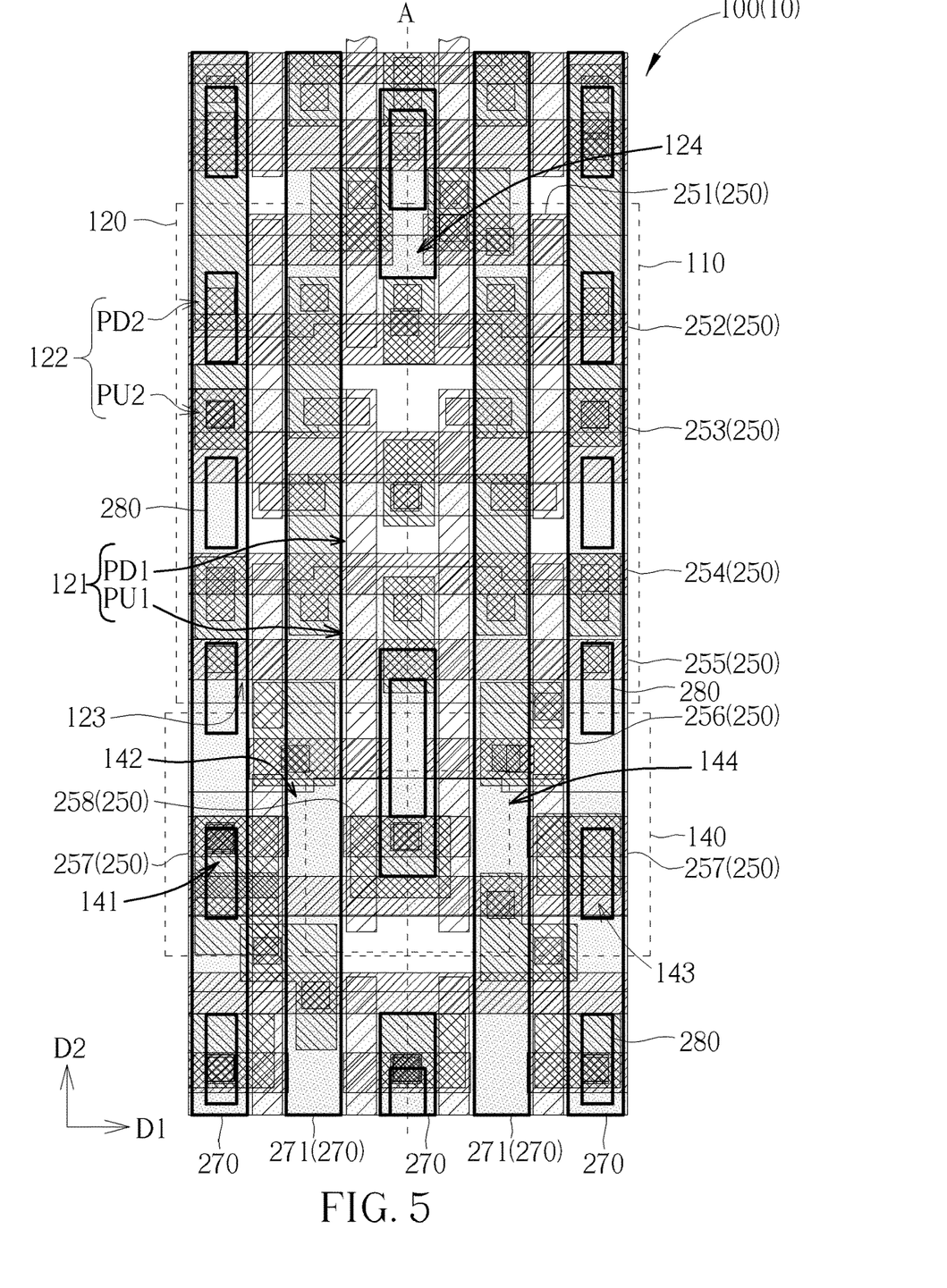
Figure 6:
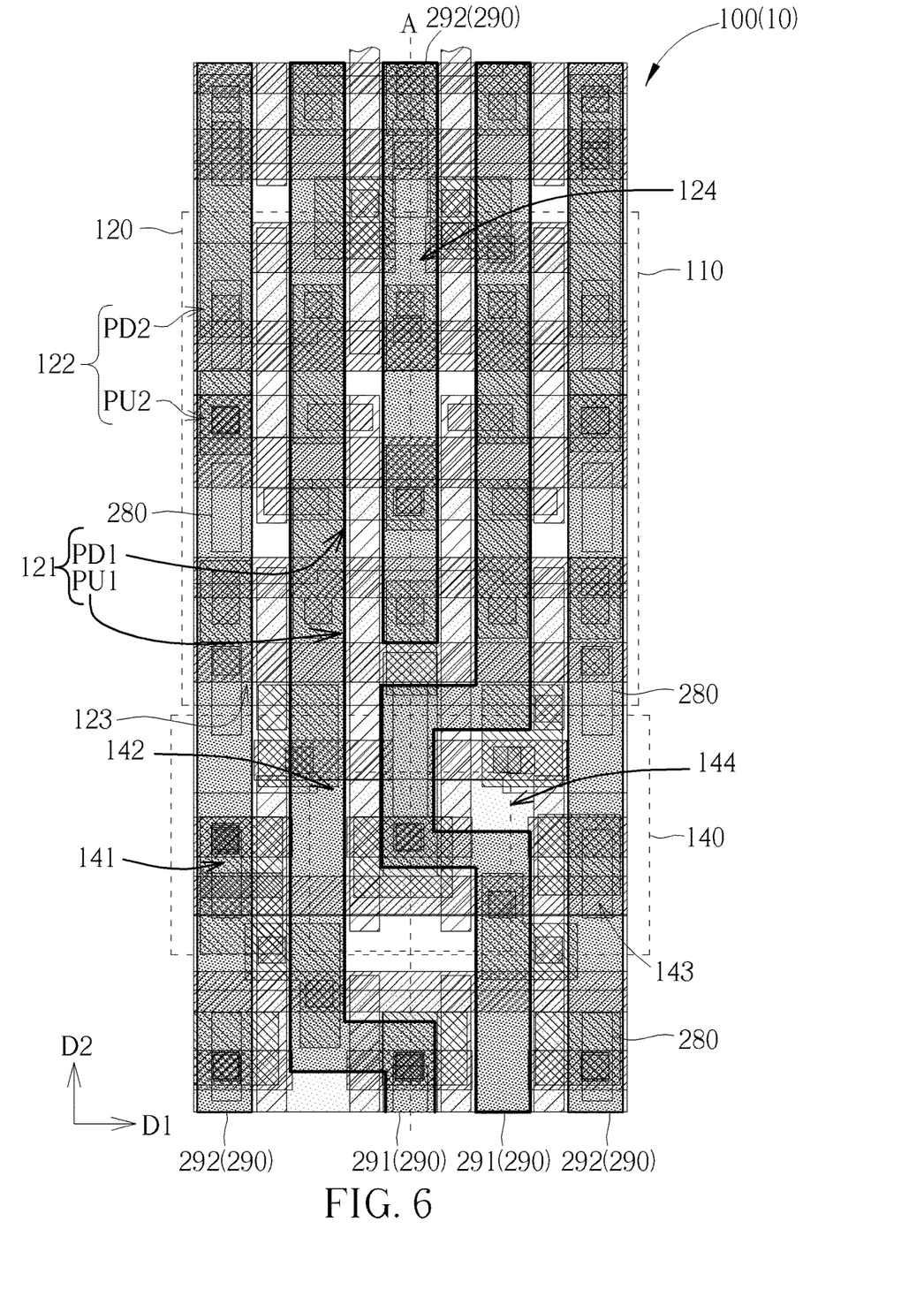

Next, please refer to FIG. 4 to FIG. 6, and also refer to FIG. 2 and FIG. 3 together. FIG. 4 is a schematic top view of a layout structure of a second metal layer (M2) and second-layered plugs (V2) of the TCAM bit cell 110. FIG. 5 is a schematic top view of a layout structure of a third metal layer (M3) and third-layered plugs (V3) of the TCAM bit cell 110. FIG. 6 is a schematic top view of a layout structure of a fourth metal layer (M4) and fourth-layered plugs (V4) of the TCAM bit cell 110. For clarity in the drawings, the reference numerals corresponding to the gate lines and the active areas are omitted in FIG. 4, FIG. 5, and FIG. 6, and the reference numerals of the aforementioned metal layer and the aforementioned plugs are also omitted.

First, as shown in FIG. 4, the TCAM bit cell 110 further includes a metal layer 250 and plugs 260 disposed in another insulating layer (not shown). The metal layer 250 is disposed above the plugs 240 and includes multiple portions extending in the first direction D1, such as a first portion 251, a second portion 252, a third portion 253, a fourth portion 254, a fifth portion 255, a sixth portion 256, a seventh portion 257 and an eighth portion 258 in sequence to electrically connect to the corresponding plugs 240. The plugs 260 are sequentially disposed above the first portion 251, the fifth portion 255, the sixth portion 256, and the seventh portion 257 of the metal layer 250. In one embodiment, the metal layer 250 and the plugs 260 include, for example, a conductive material with low-resistance, such as tungsten, aluminum, copper, etc., but not limited thereto.

In detail, the first portion 251 and the sixth portion 256 may be disposed on the corresponding plugs 240 to further electrically connect the gate of the second pass-gate transistor 124 and the gate of the first pass-gate transistor 123 in each storage unit 120 to the corresponding word line (the word line WL1 or the word line WL2 as shown in FIG. 1) through a metal layer 270 and plugs 280 as shown in FIG. 5. The second portion 252 and the fourth portion 254 are also disposed on the corresponding plugs 240 to electrically connect the source/drain region of the second pass-gate transistor 124 to the corresponding bit line (bit line BL2 as shown in FIG. 1), and electrically connect the source/drain region of the first pass-gate transistor 123 to the corresponding bit line (bit line BL1 as shown in FIG. 1). The third portion 253, the fifth portion 255 and the seventh portion 257 are also disposed on the corresponding plugs 240, so that the source/drain region of the second pull-down transistor PD2 and the source/drain region of the first pull-up transistor PU1 may be electrically connected to voltage sources (not shown in FIG. 1), respectively, and the source/drain region of the first reading transistors 141, 143 may be electrically connected to a voltage source (the voltage source P1 as shown in FIG. 1). In addition, the eighth portion 258 is also disposed on the corresponding plug 240, so that the source/drain region of the second reading transistors 142, 144 may be electrically connected to the corresponding matching line (matching line M1 or matching line M2 as shown in FIG. 1) through the metal layer 270 and the plugs 280 as shown in FIG. 5 and a metal layer 290 as shown in FIG. 6.

Therefore, the layout of the TCAM 100 of the semiconductor memory device 10 of this embodiment may be constructed of at least four layers of metal wires. The TCAM 100 includes at least two TCAM bit cells 110, and the layout structure of the TCAM bit cells 110 may be mirror-symmetrical by taking the axis A of symmetry of the TCAM 100 as the center of symmetry. It should be noted that the second metal layer (i.e., the metal layer 250) of the TCAM 100 includes bit lines (i.e., the second portion 252 and the fourth portion 254) and a portion of a voltage source line (i.e., the third portion 253, the fifth portion 255, and the seventh portion 257). The third metal layer (i.e., the metal layer 270) of the TCAM 100 includes word lines (i.e., the metal layer 271). The fourth metal layer (i.e., the metal layer 290) of the TCAM 100 includes matching lines (i.e., the metal layer 291) and another portion of the voltage source line (i.e., the metal layer 292). In this configuration, one of the voltage source lines (i.e., the metal layer 292) of the TCAM 100 may be sandwiched between two matching lines (i.e., the metal layer 291), thereby effectively achieving lower matching line (ML) coupling effect and non-charge sharing concern. Meanwhile, the TCAM 100 includes the voltage source line extending in the first direction D1 (i.e., the third portion 253, the fifth portion 255, and the seventh portion 257 of the metal layer 250) and the voltage source line extending in the second direction D2 (i.e., the metal layer 292) to forma mesh-shaped voltage source line, thereby effectively reducing the resistance of the voltage source. Therefore, the semiconductor memory device 10 of this embodiment has good performance.

Those skilled in the art should easily understand that, under the premise of satisfying the actual requirements of products, the semiconductor memory devices of the present disclosure may also have other aspects, which are not limited to the aforementioned embodiments. For example, the layout structure of the TCAM 100 may also have other aspects, which are not limited to those described in the aforementioned embodiments. The following will further describe other embodiments or variations of the semiconductor memory devices of the present disclosure. In order to simplify the description, the following description mainly focuses on the differences between the various embodiments, and the similarities are not repeated. In addition, the same elements in the various embodiments of the present disclosure are labeled with the same reference numerals to facilitate comparison between the various embodiments.

Figure 7:
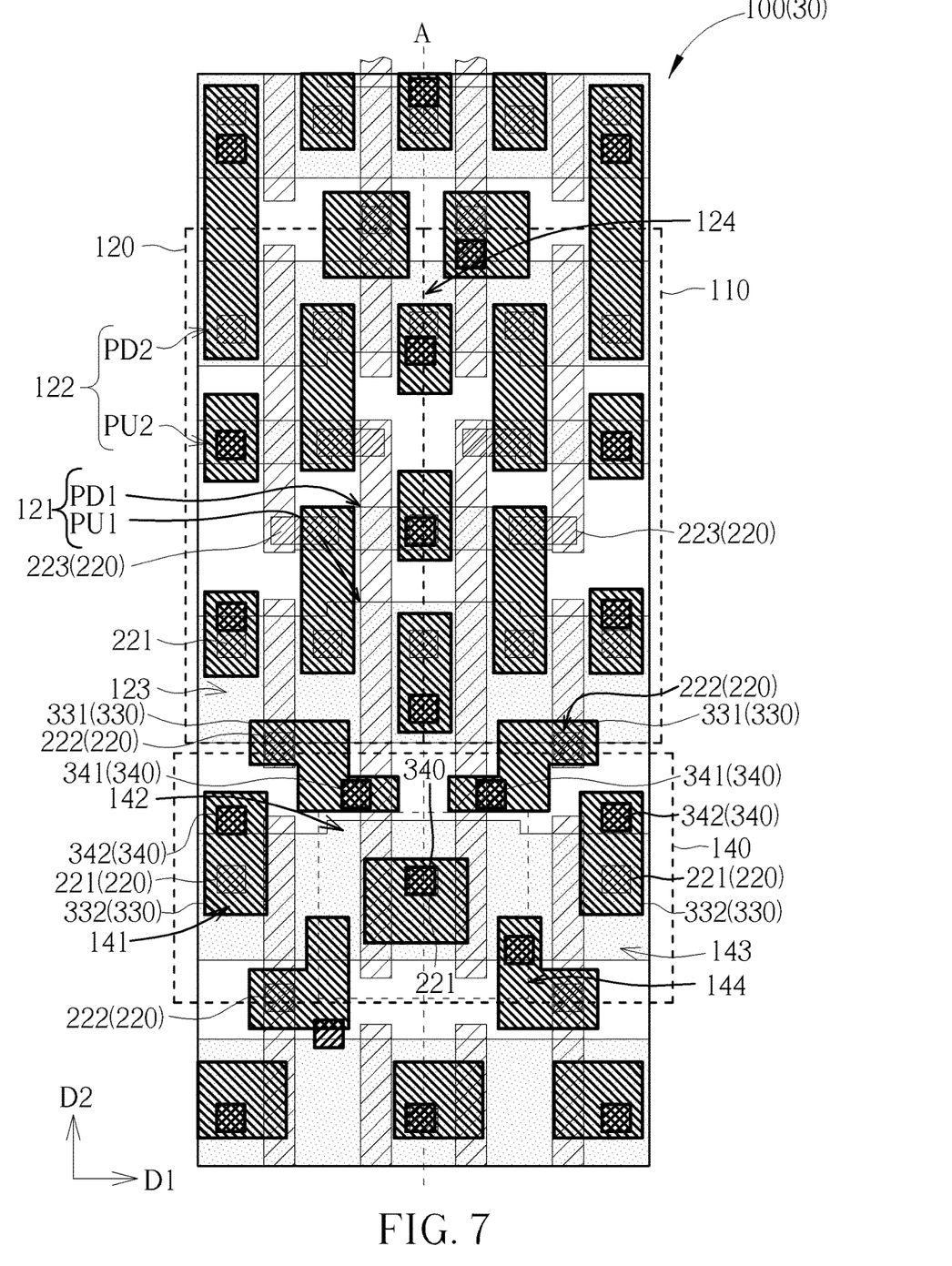
FIG. 7 to FIG. 9 illustrates schematic top views of a layout structure of a ternary content addressable memory in a semiconductor memory device according to another embodiment of the present disclosure.
Figure 8:
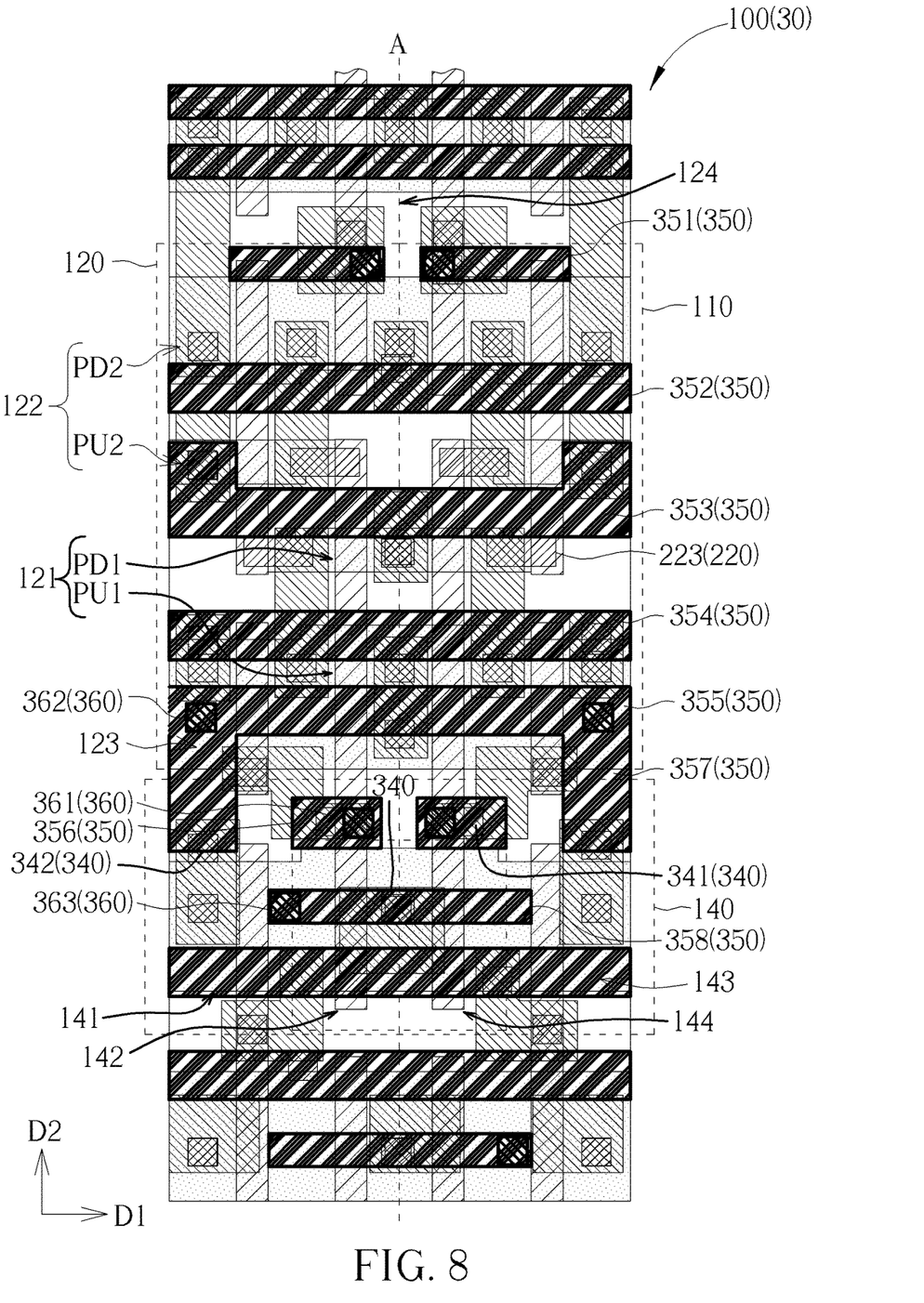
Figure 9:
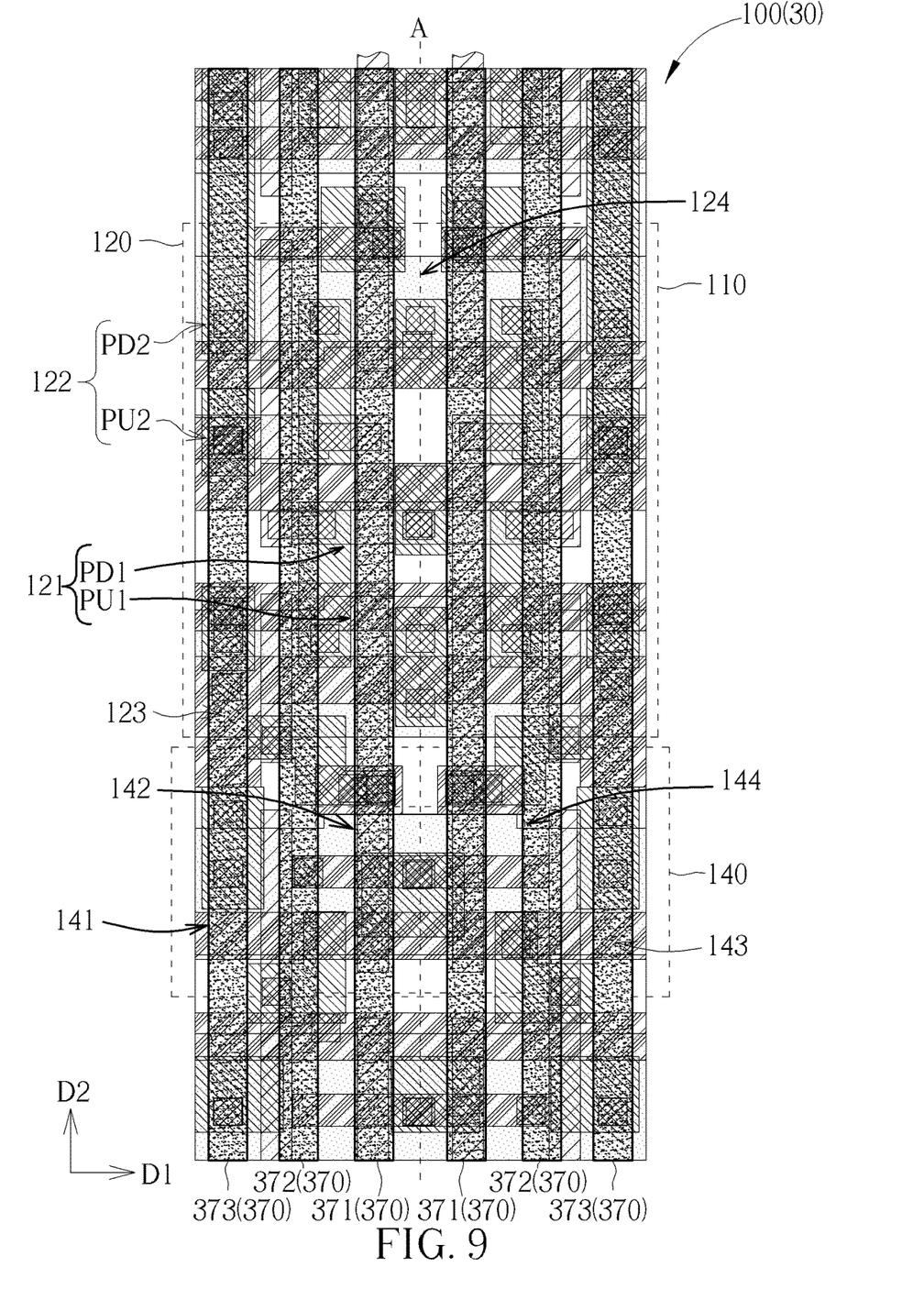

Please refer to FIG. 7 to FIG. 9, which are schematic diagrams of a layout of a TCAM 100 of a semiconductor memory device 30 according to another embodiment of the present disclosure. The layout structure of the TCAM 100 in this embodiment is substantially the same as the layout structure of the TCAM 100 in the aforementioned embodiment, and the same will not be repeated here. The main difference between this embodiment and the previous embodiment is the layout structure of the logic circuit 140.

First, please refer to FIG. 7 and FIG. 2 together. FIG. 7 is a schematic top view of a layout structure of a first metal layer (M1) and first-layered plugs (V1) of a TCAM bit cell 110, where, in order to clearly show the layout structure of the first metal layer and the first-layered plugs, the reference numerals corresponding to the gate lines and the active areas are omitted in FIG. 7. As shown in FIG. 7, the TCAM bit cell 110 further includes a metal layer 330 and plugs 340 disposed in another insulating layer (not shown), where the metal layer 330 is disposed above the plugs 220 to be electrically connected to the corresponding plugs 220. The plugs 340 are disposed on the metal layer 330 in sequence. It should be noted that the layout structure of the metal layer 330 and the plugs 340 disposed in the storage unit 120 is substantially the same as the layout structure of the metal layer 230 and the plugs 240 in the aforementioned embodiment, and will not be repeated here. Moreover, the metal layer 330 disposed in the logic circuit 140 further includes a first portion 331 and a second portion 332. Where, the first portion 331 of the metal layer 330 is electrically connected to the plug 222 (electrically connected to the gate of the first pass-gate transistor 123), and further extends from above the plug 222 to above the gate of the second reading transistors 142, 144. A plug 341 is further disposed on the first portion 331 of the metal layer 330. In detail, first, the first portion 331 extends rightward or leftward in the first direction D1, and then extends downward along the second direction D2 to the STI region 102 at the lower right or lower left of the plug 222, and finally extends toward right or left along the first direction D1 until falls above the gate of the second reading transistors 142 and 144, as shown in FIG. 7. In addition, the second portion 332 of the metal layer 330 is electrically connected to the plug 221 (electrically connected to the source/drain region of the first reading transistors 141, 143), and further extends upward in the second direction D2, and finally falls on the STI region 102 that surrounds the source/drain region of the first reading transistor 141, as shown in FIG. 7. A plug 342 is further disposed on the second portion 332 of the metal layer 330, where the plug 342 does not overlap the source/drain region of the underlying first reading transistors 141, 143.

Please refer to FIG. 8 to FIG. 9, and also refer to FIG. 2 and FIG. 7 together. FIG. 8 is a schematic top view of a layout structure of a second metal layer (M2) and second-layered plugs (V2) of the TCAM bit cell 110 in this embodiment. FIG. 9 is a schematic top view of a layout structure of a third metal layer (M3) and third-layered plugs (V3) of the TCAM bit cell 110 in this embodiment. For clarity in the drawings, the reference numerals corresponding to the gate lines and the active areas are omitted in FIG. 8 and FIG. 9, and the reference numerals of the aforementioned metal layer or the aforementioned plugs are also omitted. First, as shown in FIG. 8, the TCAM bit cell 110 further includes a metal layer 350 and plugs 360 disposed in another insulating layer (not shown). The metal layer 350 is disposed above the plugs 340 and includes multiple portions extending in the first direction D1, which are a first portion 351, a second portion 352, a third portion 353, a fourth portion 354, a fifth portion 355, a sixth portion 356, a seventh portion 357 and an eighth portion 358 in sequence to be electrically connected to the corresponding plugs 340. The plugs 360 are sequentially disposed on the metal layer 350. In an embodiment, the metal layer 350 and the plugs 360 include, for example, a conductive material with low-resistance, such as tungsten, aluminum, copper, etc., but not limited thereto.

It should be noted that the first portion 351, the second portion 352, the third portion 353, the fourth portion 354, and the fifth portion 355 of the metal layer 350 disposed in the storage unit 120 are substantially the same as the first portion 251, the second portion 252, the third portion 253, the fourth portion 254 and the fifth portion 255 of the metal layer 250 in the aforementioned embodiment, and will not be repeated here. In addition, the sixth portion 356 of the metal layer 350 is disposed on the corresponding plug 341 to electrically connect the gate of the second pass-gate transistor 124 and the gate of the first pass-gate transistor 123 in each storage unit 120 to the corresponding word line (word line WL1 or word line WL2 as shown in FIG. 1) through the plugs 361 and the metal layer 370 as shown in FIG. 9.

In addition, the seventh portion 357 and the eighth portion 358 of the metal layer 350 disposed in the logic circuit 140 are electrically connected to the corresponding voltage source and the corresponding matching line, respectively. In detail, the seventh portion 357 is disposed on the corresponding plug 342 and extends upward along the second direction D2 and directly contacts the fifth portion 355 of the metal layer 350. Thus, the seventh portion 357 and the fifth portion 355 of the metal layer 350 are in a direct contact with each other and are electrically connected to a voltage source (the voltage source P1 as shown in FIG. 1) through the plug 362 and the metal layer 370 as shown in FIG. 9. Accordingly, the source/drain region of the first reading transistors 141, 143 is electrically connected to the voltage source (the voltage source P1 as shown in FIG. 1). In addition, the eighth portion 358 is disposed on the corresponding plug 340 and extends to both sides along the first direction D1 to cross the fourth gate line 214 and the fifth gate line 215. Therefore, the plug 363 disposed on the eighth portion 358 may be located above the fifth active area 205 that is between the fourth gate line 214 and the fifth gate line 215, and is electrically connected to the corresponding matching line (matching line M1 or matching line M2 as shown in FIG. 1) through the metal layer 370 as shown in FIG. 9.

Therefore, the layout of the TCAM 100 of the semiconductor memory device 30 of this embodiment may be constructed of only three layers of metal wires. The second metal layer (i.e., the metal layer 350) of the TCAM 100 includes bit lines (i.e., the second portion 352 and the fourth portion 354) and a portion of a voltage source line (i.e., the third portion 353, the fifth portion 355 and the seventh portion 357). The third metal layer (i.e., metal layer 370) of the TCAM 100 includes word lines (i.e., the metal layer 371), matching lines (i.e., the metal layer 372) and another portion of the voltage source line (i.e., the metal layer 373). In this configuration, the layout structure of the TCAM 100 is simplified to combine both the metal wire structure of the logic circuit 104 and the metal wire structure of the storage unit 120 in the third metal layer (i.e., the metal layer 370). Furthermore, in the third metal layer (i.e., the metal layer 370), the two word lines (i.e., the metal layer 371) of the TCAM 100 may be disposed parallel to and between the two matching lines (i.e., the metal layer 372), so that the two matching lines are positioned on two opposite sides of the axis A of symmetry and pass through the center of the logic circuit 104, as shown in FIG. 9. When the first reading transistors 141, 143 and the second reading transistors 142, 144 of the logic circuit 104 are operating, the first inverter 121 (including the first pull-up transistor PU1, and the first pull-down transistor PD1), the second inverter 122 (including the second pull-up transistor PU2 and the second pull-down transistor PD2), the first pass-gate transistor 123 and the second pass-gate transistor 124 of the storage unit 120 do not operate at the same time. In other words, when the first reading transistors 141, 143 and the second reading transistors 142, 144 of the logic circuit 104 are operating, the two word lines (i.e., the metal layer 371) turn off their writing functions and may be used as a voltage source line (Vss potential). Therefore, although there are the word lines (i.e., the metal layer 371), not a voltage source line, disposed between the two matching lines (i.e., the metal layer 372) in the layout structure of this embodiment, the word lines (i.e., the metal layer 371) between the two matching lines (i.e., the metal layer 372) may be used as a voltage source line (Vss potential) while the semiconductor memory device is actually operating, thereby also effectively achieving lower matching line coupling effect and non-charge sharing concern. In addition, the TCAM 100 of this embodiment also includes a voltage source line extending in the first direction D1 (i.e., the third portion 353 and the fifth portion 355 of the metal layer 350) and a voltage source line extending in the second direction D2 (i.e., the seventh portion 357 of the metal layer 350 and the metal layer 373) to form a mesh-shaped voltage source line, thereby effectively reducing the resistance of the voltage source. Therefore, the semiconductor memory device 30 of this embodiment has good performance under the premise that the layout structure of the TCAM 100 is simplified.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout of a semiconductor memory device, comprising:
   a substrate; and
   a ternary content addressable memory (TCAM), disposed on the substrate, wherein the TCAM comprises a plurality of TCAM bit cells, and at least two of the TCAM bit cells are mirror-symmetrical along an axis of symmetry, wherein each of the TCAM bit cells comprises:
      two storage units, electrically connected to two word lines, respectively; and
      a logic circuit, electrically connected to the two storage units, wherein the logic circuit comprises:
         two first reading transistors; and
         two second reading transistors, wherein each of the second reading transistors comprises a gate and two source and drain regions, and the two source and drain regions of the two second reading transistors are electrically connected to two matching lines and the two first reading transistors, respectively, wherein the word lines are disposed parallel to and between the matching lines.

2. The layout of the semiconductor memory device of claim 1, wherein the word lines pass through a center of the logic circuit.

3. The layout of the semiconductor memory device of claim 1, wherein each of the storage units comprises a static random access memory.

4. The layout of the semiconductor memory device of claim 1, wherein each of the storage units comprises:
   a first inverter, comprising an input terminal and an output terminal;
   a second inverter, comprising an input terminal and an output terminal, wherein the output terminal of the second inverter is electrically connected to the input terminal of the first inverter;
   a first transistor, comprising a gate and two source and drain regions, wherein the two source and drain regions of the first transistor are electrically connected to the output terminal of the second inverter and a first bit line, respectively; and
   a second transistor, comprising a gate and two source and drain regions, wherein the two source and drain regions of the second transistor are electrically connected to the input terminal of the second inverter and a second bit line, respectively, and the gate of the second transistor and the gate of the first transistor are electrically connected to one of the word lines.

5. The layout of the semiconductor memory device of claim 4, wherein each of the first reading transistors comprises a gate and two source and drain regions, wherein the gate of each of the first reading transistors is electrically connected to a searching line, and the gate of each of the second reading transistors is electrically connected to the input terminal of the second inverter.

6. The layout of the semiconductor memory device of claim 5, further comprising:
   a plurality of first plugs, disposed on the source and drain regions and the gate of the first transistor, and disposed on the source and drain regions of the first reading transistors and the source and drain regions of the second reading transistors;
   a first metal layer, disposed on the plurality of first plugs to be electrically connected to the first plugs, wherein a first portion of the first metal layer is disposed on the gate of the second transistor, and the first portion of the first metal layer extends from above the gate of the first transistor to above the gate of one of the second reading transistors, and a second portion of the first metal layer is disposed on the source and drain regions of the first reading transistors; and
   a plurality of second plugs, disposed on the first metal layer to be electrically connected to the first metal layer.

7. The layout of the semiconductor memory device of claim 6, further comprising:
   a second metal layer, disposed on the second plugs to be electrically connected to the second plugs; and
   a plurality of third plugs, disposed on the second metal layer to be electrically connected to the second metal layer.

8. The layout of the semiconductor memory device of claim 7, further comprising:
   a third metal layer, disposed on the third plugs to be electrically connected to the third plugs, wherein the third metal layer comprises the word lines and the matching lines.

9. The layout of the semiconductor memory device of claim 6, wherein the second portion of the first metal layer extends from above the source and drain regions of the first reading transistors to above a shallow trench isolation region, and the shallow trench isolation region surrounds the source and drain regions of the first reading transistors.

10. The layout of the semiconductor memory device of claim 9, wherein the second plugs electrically connected to the second portion of the first metal layer do not overlap the source and drain regions of the first reading transistors.

11. The layout of the semiconductor memory device of claim 9, further comprising:
   a plurality of doped regions, disposed in the substrate and surrounded by the shallow trench isolation region, wherein the doped regions extend in a first direction, and the doped regions comprise a first doped region and a second doped region arranged in sequence in a second direction perpendicular to the first direction; and a plurality of gate lines, disposed on the substrate to cross the doped regions, wherein the gate lines extend in the second direction and comprise a first gate line, and the first gate line crosses both the first doped region and the second doped region to form the gates of the second reading transistors.

12. The layout of the semiconductor memory device of claim 11, wherein the gate lines further comprise a second gate line and a third gate line, the second gate line crosses the first doped region, and the third gate line crosses both the second doped region and the first doped region to form the gate of the first transistor and the gates of the first reading transistors, respectively.

13. The layout of the semiconductor memory device of claim 7, wherein a first portion and a second portion of the second metal layer respectively extend along two directions that are perpendicular to each other, and the first portion and the second portion of the second metal layer are in a direct contact with each other.

14. The layout of the semiconductor memory device of claim 11, wherein the second portion of the second metal layer is disposed above the source and drain regions of the first reading transistors, and the first portion of the second metal layer crosses above the first transistor and the first inverter.

15. The layout of the semiconductor memory device of claim 11, wherein the second metal layer comprises a voltage source line.

16. The layout of the semiconductor memory device of claim 11, wherein a third portion of the second metal layer is disposed above the storage units and comprises the first bit line and the second bit line.

* * * * *